United States Patent [19]

Saito

[11] Patent Number: 5,496,592
[45] Date of Patent: Mar. 5, 1996

[54] METHOD AND APPARATUS FOR CONTROLLING ION IMPLANTATION UNIT FOR EARLY DETECTION OF ION IMPLANTATION ERROR

[75] Inventor: Yoshiyuki Saito, Yamagata, Japan

[73] Assignee: NEC Corporation, Tokyo, Japan

[21] Appl. No.: 358,594

[22] Filed: Dec. 14, 1994

[30] Foreign Application Priority Data

Dec. 22, 1993 [JP] Japan ................................ 5-324992

[51] Int. Cl.$^6$ .................................................. C23C 14/00
[52] U.S. Cl. ........................ 427/523; 118/665; 118/688; 118/715; 427/248.1
[58] Field of Search ................................ 427/523, 248.1; 118/665, 688, 715

Primary Examiner—Bernard Pianalto
Attorney, Agent, or Firm—Foley & Lardner

[57] ABSTRACT

In controlling an ion implantation unit, a dose of ions is calculated for every lot, and it is determined whether or not the dose D of ions is within an allowable range. When the dose of ions is within the allowable range, the ion implantation unit is operated for the next lot. When the dose of ions is not within the allowable range, the ion implantation unit is stopped.

9 Claims, 2 Drawing Sheets

METHOD AND APPARATUS FOR CONTROLLING ION IMPLANTATION UNIT FOR EARLY DETECTION OF ION IMPLANTATION ERROR

BACKGROUND OF THE INVENTION

1. Field of the Invention

The present invention relates to a method and apparatus for controlling an ion implantation unit.

2. Description of the Related Art

Ion implantation units have been broadly used in manufacture of semiconductor devices, for example, in formation of impurity diffusion regions within a semiconductor substrate.

Generally, an ion implantation apparatus performs an ion implantation upon a lot formed by a plurality of wafers. After an ion implantation operation upon the wafers of one lot is completed, one of the wafers is selected. Then, in order to check the ion implantation operation, the resistance of this selected wafer is measured, and it is determined whether or not the measured resistance is within an allowable range. When the measured resistance is within the allowable range, this lot is transferred to the next process. On the contrary, when the measured resistance is not within the allowable range, this lot is deemed to be defective and is scrapped.

In the prior art, however, when the resistance of one lot is being checked, the ion implantation unit may perform an ion implantation upon the next lot under the same condition. Therefore, when one lot is deemed to be defective, the next lot may also be defective. This means a large number of defective lots may occur.

SUMMARY OF THE INVENTION

It is an object of the present invention to provide a methods and apparatus for controlling an ion implantation unit which can detect an ion implantation error earlier.

According to the present invention, in controlling an ion implantation unit, a dose of ions is calculated for every lot, and it is determined whether or not the dose of ions is within an allowable range. When the dose of ions is within the allowable range, the ion implantation unit is operated for the next lot. When the dose of ions is not within the allowable range, the ion implantation unit is stopped. Thus, the implantation condition for the next lot can be changed, to avoid the next lot from being defective.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENT

Figure 1:
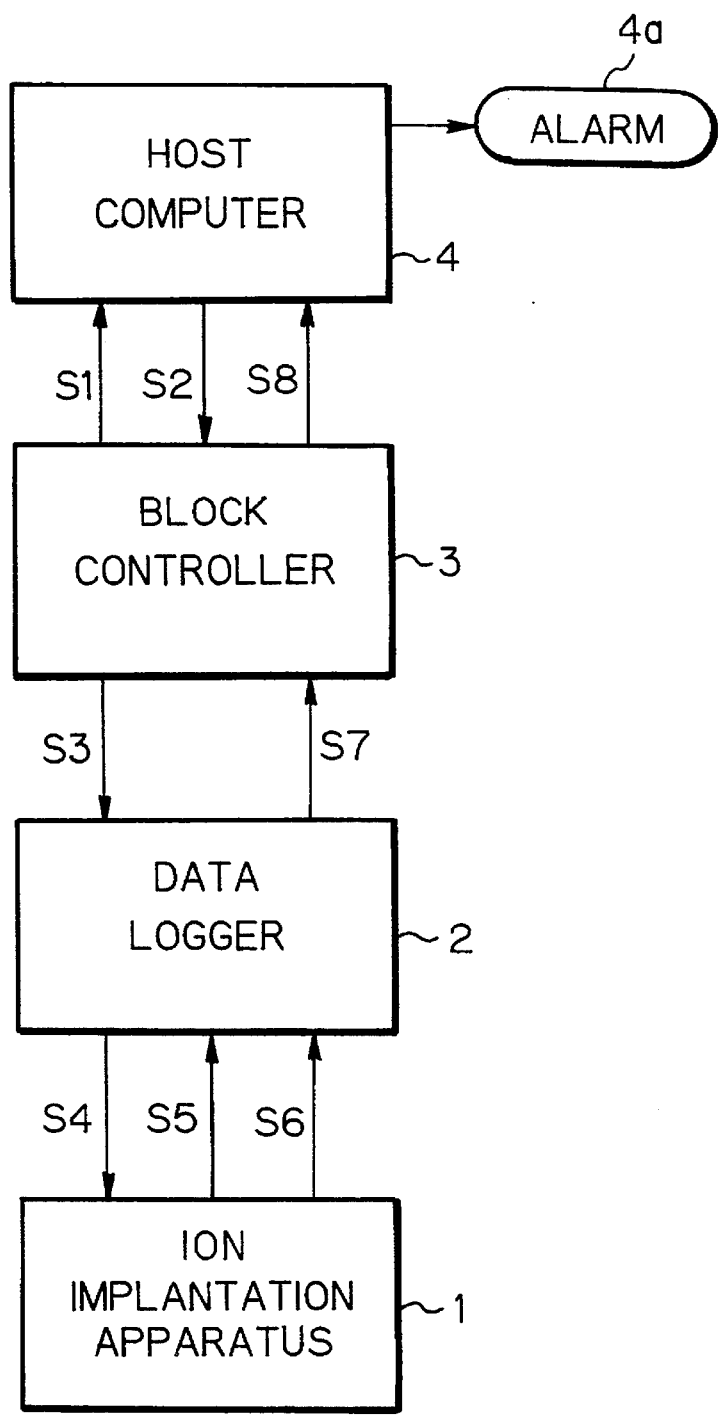
FIG. 1 is a block diagram illustrating an embodiment of the apparatus for controlling an ion implantation unit according to the present invention.

In FIG. 1, which illustrates an embodiment of the present invention, reference numeral 1 designates an ion implantation unit connected to a data logger 2. The data logger 2 sets an ion implantation condition for the ion implantation unit 1, and also carries out an interlock operation monitoring operation and storing of data for the ion implantation unit 1.

The data logger 2 is connected via a block controller 3 to a host computer 4. When the host computer 4 establishes criteria for an operating condition and transmits it to the block controller 3, the operation of the ion implantation unit 1 is started. Conversely, when the ion implantation unit 1 completes an ion implantation completes, the block controller 3 generates data of an operating result and transmits it to the host computer 4.

The operation of the controlling apparatus of FIG. 1 is explained next in detail.

First, the block controller 3 generates an operation start request signal S1 and transmits it to the host computer 4.

Next, the host computer 4 generates a signal S2 indicating an operating condition and transmits it to the block controller 3. This signal S2 includes the following information:

the kind of ions such as boron ions, arsenic ions or phosphorus ions;

an analyzer magnet value;

an acceleration voltage of ions;

a dose of ions;

an ion beam current value; and an ion beam current range (an upper beam current and a lower beam limit).

When the block controller 3 receives the signal S2 from the host computer 4, the block controller 3 generates a signal S3 substantially the same as the signal S2 and transmits it to the data logger 2. Subsequently, when the data logger 2 receives the signal S3 from the block controller 3, the data logger 2 generates a signal S4 substantially the same as the signal S3 and transmits it to the ion implantation unit 1, thus starting the operation thereof.

Each time the ion implantation unit 1 completes an ion implantation upon one wafer, the ion implantation unit 1 generates a signal S5 and transmits it to the data logger 2. The signal S5 includes the following information:

the kind of ions;

an ion beam current value;

an ion implantation time period;

the analyzer magnet value;

an X-scanning frequency;

a Y-scanning frequency;

a degree of vacuum in an ion source;

a degree of vacuum in a beam line; and a degree of vacuum in an end station.

When the ion implantation unit 1 completes an ion implantation upon all of the wafers of a lot, the ion implantation unit 1 generates a lot completion signal S6 and transmits it to the data logger 2. As a result, the data logger 2 carries out the following calculations:

a mean value I of the ion beam current values within the lot;

a mean value T of the ion implantation operation time periods per one wafer within the lot;

a mean value of the ion acceleration voltages; and a mean value of the degree of vacuum in the end station.

Then, the data logger 2 transmits a signal S7 including these mean values in addition to the number of processed wafers, the kinds of ions, and the dose of ions to the block controller 3. Subsequently, the block controller 3 transmits a lot completion signal S8 substantially the same as the signal 7 to the host computer 4.

Figure 2:
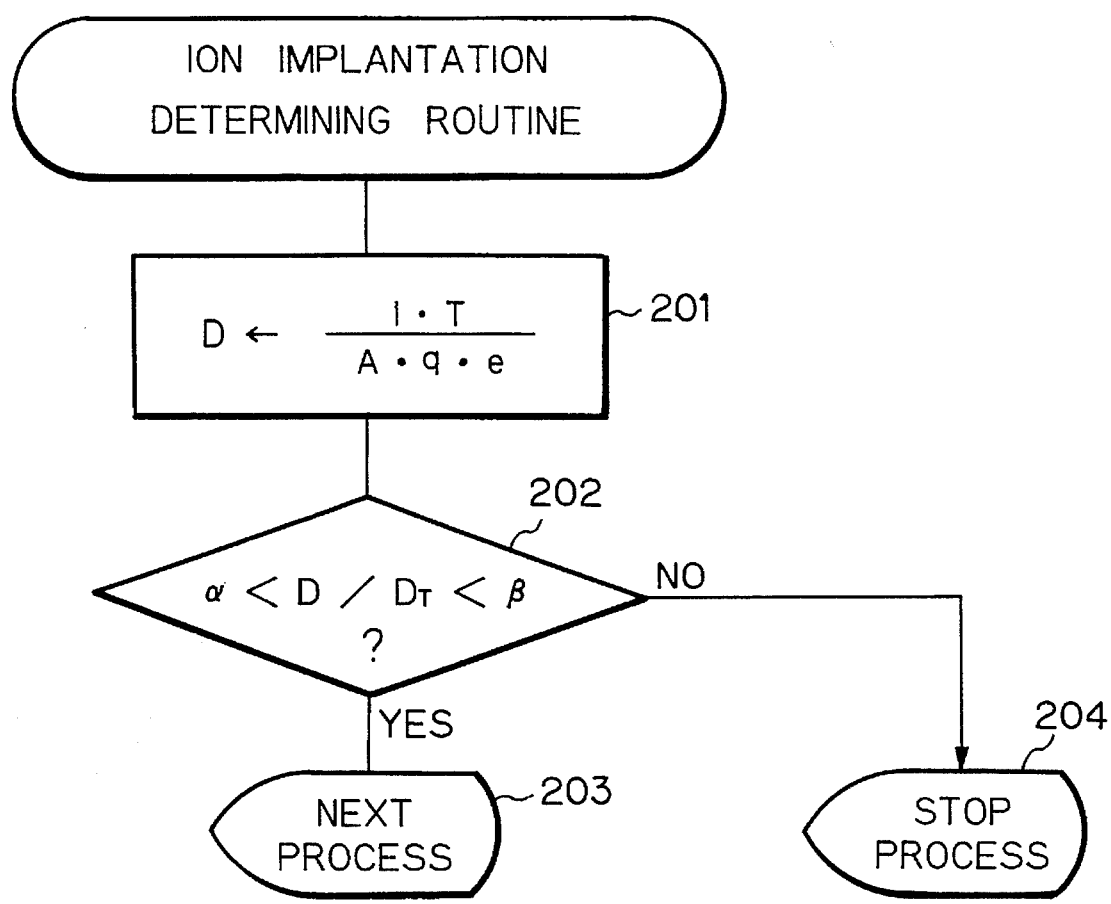
FIG. 2 is a flowchart showing the operation of the host computer of FIG. 1.

When the host computer 4 receives the lot completion signal S8 from the block controller 3, the host computer 4 carries out an ion implantation determination routine as shown in FIG. 2.

Referring to FIG. 2, at step 201, an actual mean dose D of ions per one wafer is calculated by $$D \leftarrow \frac{I \cdot T}{A \cdot q \cdot e} \text{ (cm}^{-2}\text{)}$$

where A is an area to be implanted per one wafer;

q is the number of charges per one ion dependent upon the kinds of ions; and e is $1.602 \times 10^{-19}$ Coulomb.

Then, at step 202, it is determined whether or not the calculated mean value D is within an allowable range. That is, it is determined whether or not $\alpha < D/D_T < \beta$, for example, $0.95 < D/D_T < 1.05$ is satisfied. Note that $D_T$ is a target value of the dose of ions.

As a result, when the dose D of ions per one wafer is within the allowable range, the control proceeds to step 203 which waits for another signal S1 from the block controller 3. That is, if the host computer 4 receives the signal S1 again, the above-mentioned steps are repeated for another lot under the same operating condition.

Conversely, when the dose D of ions per one wafer is not within the allowable range, the control proceeds to step 204 which stops the operation of the ion implantation unit 1. Also, in this case, the host computer 4 activates an alarm 4a, to inform an operator of an abnormal ion implantation state. Thus, the operating condition can be changed by the operator for another lot.

Note that, in the above-described embodiment, although it is determined whether or not the dose of ions per wafer is within the allowable range, it is possible to determine whether or not the dose of ions per one lot is within an allowable range of the lot.

As explained hereinbefore, according to the present invention, since an ion implantation error is detected early, the generation of a large number of defective lots can be avoided.

I claim:

1. A method for controlling an ion implantation unit, comprising the steps of:

calculating a dose of ions implanted by said ion implantation unit into a lot;

determining whether or not said dose of ions is within an allowable range;

operating said ion implantation unit for the next lot when said dose of ions is within the allowable range; and stopping the operation of said ion implantation unit when said dose of ions is not within the allowable range.

2. A method for controlling an ion implantation unit which can implant ions into a lot formed by a pluality of wafers, comprising the steps of:

calculating an average dose of ions per wafer implanted by said ion implantation unit into the wafers of said lot;

determining whether or not said average dose of ions per wafer is within an allowable range;

operating said ion implantation unit for the next lot when said average dose of ions per wafer is within the allowable range; and stopping the operation of said ion implantation unit when said average dose of ions per wafer is not within the allowable range.

3. A method as set forth in claim 2, wherein said average ion dose calculating step calculates said average dose of ions per wafer by $$\frac{I \cdot T}{A \cdot q \cdot e} \text{ (cm}^{-2}\text{)}$$

where I is a mean value of an ion beam current flowing through said ion implantation unit;

T is a mean value of an ion implantation operation time period per wafer;

A is an area to be implanted per wafer;

q is a number of charges per one ion; and e is $1.602 \times 10^{-19}$ Coulomb.

4. An apparatus for controlling an ion implantation unit, comprising:

means for calculating a dose of ions implanted by said ion implantation unit into a lot;

means for determining whether or not said dose of ions is within an allowable range;

means for operating said ion implantation unit for the next lot when said dose of ions is within the allowable range; and means for stopping the operation of said ion implantation unit when said dose of ions is not within the allowable range.

5. An apparatus for controlling an ion implantation unit which can implant ions into a lot formed by a pluality of wafers, comprising:

means for calculating an average dose of ions per wafer implanted by said ion implantation unit into the wafers of said lot;

means for determining whether or not said average dose of ions per wafer is within an allowable range;

means for operating said ion implantation unit for the next lot when said average dose of ions per wafer is within the allowable range; and means for stopping the operation of said ion implantation unit when said average dose of ions per wafer is not within the allowable range.

6. An apparatus as set forth in claim 5, wherein said average ion dose calculating step calculates said average dose of ions per wafer by $$\frac{I \cdot T}{A \cdot q \cdot e} \text{ (cm}^{-2}\text{)}$$

where I is a mean value of an ion beam current flowing through said ion implantation unit;

T is a mean value of an ion implantation operation time period per wafer;

A is an area to be implanted per wafer;

q is a number of charges per one ion; and e is $1.602 \times 10^{-19}$ Coulomb.

7. An apparatus for controlling an ion implantatation unit, comprising:

a data logger, connected to said ion implantation unit, for establishing an operating condition to operate said ion implantation unit and for calculating a mean value of an ion beam current flowing through said ion implantation unit and a mean value of an ion implantation operation time period; and a control circuit, connected to said data logger, for calculating a dose of ions implanted by said ion implantation unit into a lot in accordance with the mean value of the ion beam current and the mean value of the ion implantation operation time period, determining whether or not said dose of ions is within an allowable range, operating said ion implantation unit for the next lot via said data logger when said dose of ions is within the allowable range, and stopping the operation of said ion implantation unit via said data logger when said dose of ions is not within the allowable range.

8. An apparatus for controlling an ion implantation unit which can implant ions into a lot formed by a pluality of wafers, comprising:

a data logger, connected to said ion implantation unit, for establishing an operating condition to operate said ion implantation unit and for calculating a mean value of an ion beam current flowing through said ion implantation unit and a mean value of an ion implantation operation time period; and a control circuit, connected to said data logger, said control circuit comprising:

means for calculating an average dose of ions per wafer implanted by said ion implantation unit into the wafers of said lot;

means for determining whether or not said average dose of ions per wafer is within an allowable range;

means for operating said ion implantation unit for the next lot when said average dose of ions per wafer is within the allowable range; and means for stopping the operation of said ion implantation unit when said average dose of ions per wafer is not within the allowable range.

9. An apparatus as set forth in claim 8, wherein said average ion dose calculating step calculates said average dose of ions per wafer by $$\frac{I \cdot T}{A \cdot q \cdot e} \ (cm^{-2})$$

where I is a mean value of an ion beam current flowing through said ion implantation unit;

T is a mean value of an ion implantation operation time period per wafer;

A is an area to be implanted per wafer;

q is a number of charges per one ion; and e is $1.602 \times 10^{-19}$ Coulomb.

* * * * *